(12) United States Patent
Savicki, Jr. et al.

(10) Patent No.: US 12,396,114 B2
(45) Date of Patent: Aug. 19, 2025

(54) ELECTRICAL WIRING DEVICE ASSEMBLIES WITH EASY TO CLEAN SURFACES

(71) Applicant: Pass & Seymour, Inc., Syracuse, NY (US)

(72) Inventors: Gerald R. Savicki, Jr., Canastota, NY (US); Richard Rohmer, Memphis, NY (US); Patrick J. Murphy, Marcellus, NY (US); Clayton Roberts, Tully, NY (US); Syed J. Jamal, Rochester, NY (US); Theodore P. Junko, Manlius, NY (US); Alec J. Brindisi, Syracuse, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 311 days.

(21) Appl. No.: 17/704,385

(22) Filed: Mar. 25, 2022

(65) Prior Publication Data
US 2022/0330446 A1    Oct. 13, 2022

Related U.S. Application Data

(60) Provisional application No. 63/166,540, filed on Mar. 26, 2021.

(51) Int. Cl.
*H05K 5/03* (2006.01)
*H05K 5/02* (2006.01)

(52) U.S. Cl.
CPC ............. *H05K 5/03* (2013.01); *H05K 5/0208* (2013.01); *H05K 5/0217* (2013.01)

(58) Field of Classification Search
CPC ...................................................... H05K 7/00
See application file for complete search history.

(56) References Cited

U.S. PATENT DOCUMENTS 7,273,983 B1 *  9/2007  Rintz ..................... F21S 8/035
                                                         174/67

OTHER PUBLICATIONS

Schneider Electric, Square D Wiring Devices for Modern Living brochure, 2020, pp. 1-22, document No. 998-20940517_GMA-US.
Schneider Electric, Life is on brochure, 2019, pp. 1-12, document No. 998-20769353_GMA-US.

* cited by examiner

*Primary Examiner* — Jerry Wu
(74) *Attorney, Agent, or Firm* — Bond, Schoeneck & King, PLLC; Frederick J. M. Price

(57) ABSTRACT

An electrical wiring device assembly having a uniform user facing surface that can be provided with a new electrical wiring device or retrofit to an existing wiring device. The surface is a sleeve that omits crevices, gaps, indentations and other irregularities that can collect and harbor harmful pathogens. The sleeve can be rigid or flexible and is coupled to the wiring device to allow a user to operate the wiring device, such as by allowing a user to move a toggle or paddle switch, while covering the user facing side of the wiring device.

6 Claims, 12 Drawing Sheets

ELECTRICAL WIRING DEVICE ASSEMBLIES WITH EASY TO CLEAN SURFACES

CROSS-REFERENCE TO RELATED APPLICATIONS

The present application claims priority to U.S. Provisional Application No. 63/166,540, filed on Mar. 26, 2021.

BACKGROUND OF THE INVENTION

1. Field of the Invention

The present invention relates generally to electrical wiring devices, and particularly to electrical wiring device assemblies having easy to clean user facing surfaces.

2. Description of the Related Art

Electrical power is provided to users by way of electrical distribution systems that typically include electrical wiring from a utility power source to a breaker panel disposed in a house, building or some other facility. The breaker panel distributes AC power to one or more branch electric circuits installed at various locations throughout a structure. The electric circuits may typically include one or more electrical wiring devices that regulate, monitor or provide AC power to other devices. There are a variety of electrical wiring devices available to the consumer including outlet receptacles, light switches, dimmers, fan speed controls and timers.

Each electrical wiring assembly has a user facing surface, which can include a cover plate or other surface in combination with the surface of the device itself. There are several drawbacks associated with cleaning electrical wiring device assembly surfaces. Conventional device assemblies can have nonuniform surfaces, and surfaces with crevices, gaps, indentations and/or other irregularities that can collect and harbor harmful bacteria/viruses and make such device assemblies hard to clean (and can allow cleaning material to get therein and potentially damage the electrical wiring device assembly product).

What is needed are electrical wiring device assemblies with user facing surfaces that are easier to clean and are less likely to harbor harmful bacteria/viruses as compared to conventional electrical wiring device assemblies.

Description of the Related Art Section Disclaimer: To the extent that specific patents/publications/products are discussed above in this Background Section or elsewhere in this Applications, these discussions should not be taken as an admission that the discussed patents/publications/products are prior art for patent law purposes. For example, some or all of the discussed patents/publications/products may not be sufficiently early in time, may not reflect subject matter developed early enough in time and/or may not be sufficiently enabling so as to amount to prior art for patent law purposes. To the extent that specific patents/publications/products (and/or specific portions thereof) are discussed above in this Background Section and/or throughout the application, the descriptions/disclosures of which are all hereby incorporated by reference into this document in their respective entirety(ies) (or at least the specific references sections are incorporated by reference into this document in their respective entirety(ies), as may be applicable).

BRIEF SUMMARY OF THE INVENTION

The present invention addresses the needs described above by providing electrical wiring device assemblies that have or can be retrofitted with more uniform user facing surfaces, and that have less or no crevices, gaps, indentations and/or other irregularities that can collect and harbor harmful bacteria/viruses as compared to conventional electrical wiring device assemblies. Such a structural configuration allows for quicker and less laborious cleaning of the user facing surface.

In an example, the electrical wiring device assembly comprises a sleeve dimensioned to be positioned in covering relation to a front of an electrical wiring device, wherein the sleeve has a uniform surface and includes an undercut extending around an interior of the sleeve for engaging with a plate of the electrical wiring device. The plate of the electrical wiring device may comprise a wall plate of the electrical wiring device. The plate of the electrical wiring device may instead comprise a mounting plate configured to be positioned behind the wall plate of the electrical wiring device. The electrical wiring device assembly may have a sleeve that is flexible and the sleeve may include a feature positioned to align with a switch of the electrical wiring device. The sleeve may instead be rigid.

In an example, the electrical wiring device assembly may have a mounting plate having a set of rails for slidingly engaging the undercut of the sleeve so that the sleeve can move between a first position and second position. The sleeve may include a feature mounted to an underside surface and positioned to engage a switch of the electrical wiring device. The feature may comprise a roller for engaging a rocker switch. The feature may instead comprise a pair of projections for engaging a toggle switch.

In an example, the electrical wiring device assembly may have a sleeve that is rigid and operatively coupled to an internal switch of the electrical wiring device. The sleeve may form a paddle switch operatively coupled to the internal switch of the electrical wiring device. The assembly may further comprise a subframe coupled to the electrical wiring device and forming a barrier preventing access to an interior of the electrical wiring device. The sleeve may comprise a glass wall plate and the electrical wiring device comprises a touch switch.

In a further example, the electrical wiring device assembly may include a cover or wall plate that completes the enclosure and is also configured and structured to act as the actuator for the electrical wiring device (i.e., the cover/wall plate acts can be a unitary component and act as the protective barrier and also as the switch that can be actuated that can turn on/off a device, as discussed herein). The cover/wall plate can be made from formed of a chemically resistant or antibacterial material. The cover/wall plate can be made from glass, plastic, or polymer material (including, for example, polyethylene terephthalate, polypropylene, high-density polyethylene, low-density polyethylene, and polyvinyl chloride) as should be understood by a person of ordinary skill in the art in conjunction with a review of this disclosure.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
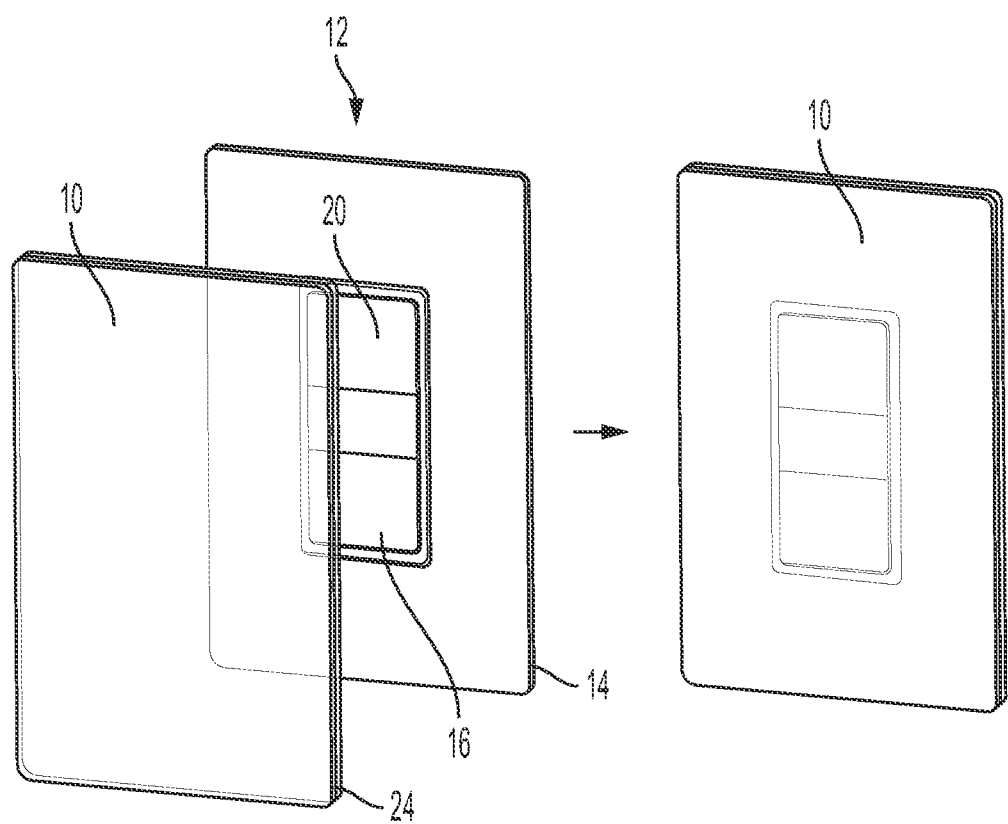
FIG. 1 is a perspective view of an embodiment of an easily cleaned surface of an electrical wiring device according to the present invention.
Figure 2:
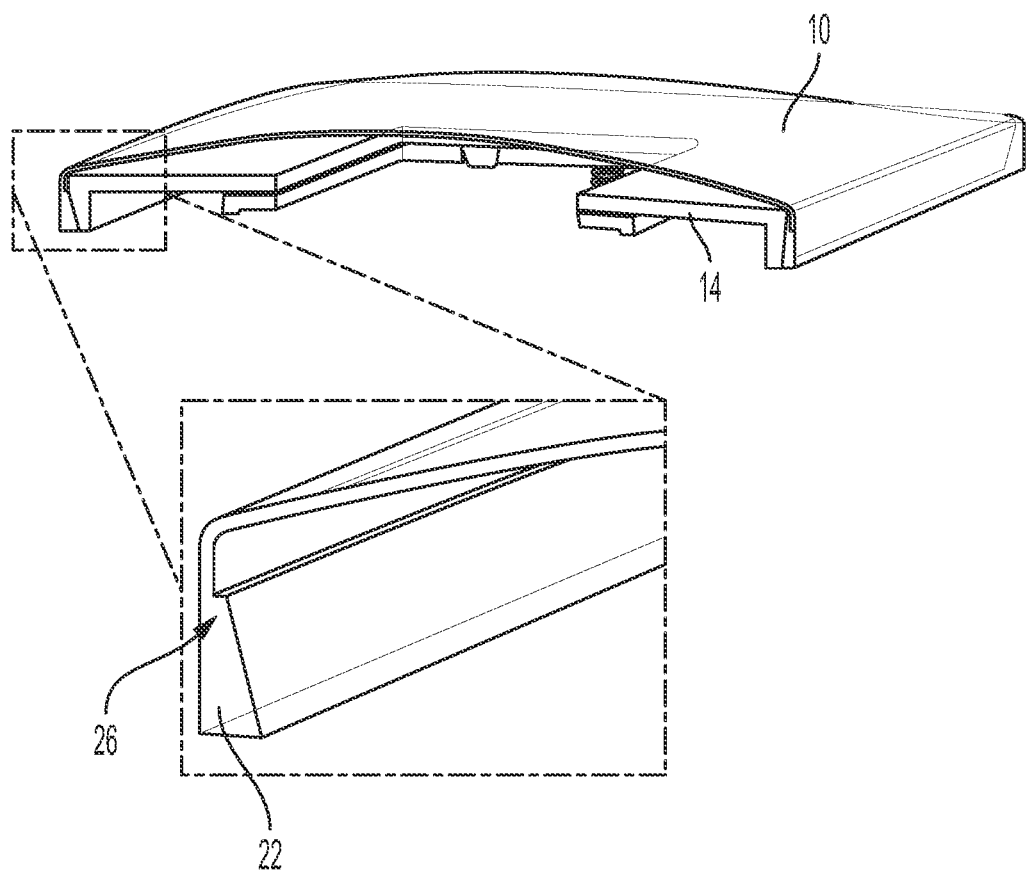
FIG. 2 is cross-sectional view of the first embodiment seen in FIG. 1 along with a close-up view.

Referring to the figures, wherein like numerals refer to like parts throughout, there is seen in FIG. 1 a sleeve 10 that can be placed in covering relation to an electrical wiring device 12, such as a wall plate 14 having a light switch 16 positioned therein, to provide an easily cleaned surface according to the present invention. Sleeve 10 is generally rectangular and dimensioned to fit completely over wiring device 12. The front face 20 of sleeve is formed from a material that is flexible, transparent, and can be easily cleaned by wiping. Referring to FIG. 2, the inside 22 of sleeve 10 includes a wall 22 extending around the peripheral edge 24 of front face 20 and formed integrally therewith. Inside 22 of sleeve 10 includes an undercut 26 positioned around the inside perimeter of wall 22 that is dimensioned to allow sleeve 10 to be snap fit over wall plate 14. Switch 16 may be operated by applying pressure to the appropriate location of front face 20 of sleeve 10. As sleeve 10 does not include any crevices, slots, or other features, wiring device 12 can be cleaned simply by wiping the surface of sleeve 14 to remove any residue.

Figure 3:
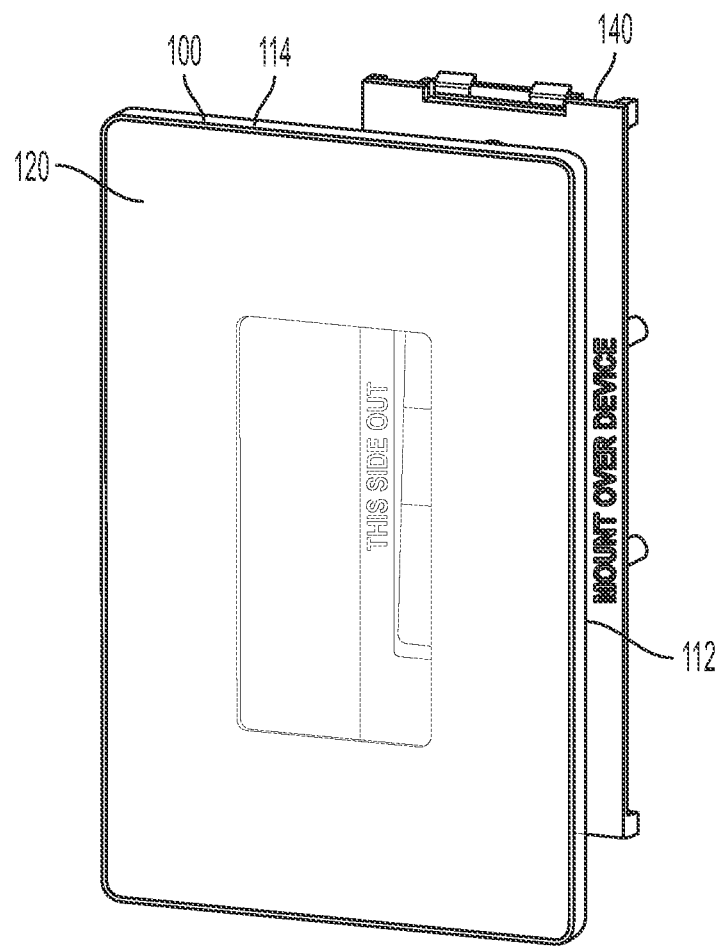
FIG. 3 is a perspective view of another embodiment of an easily cleaned surface of an electrical wiring device according to the present invention.

Referring to FIG. 3, an embodiment of the present invention comprises a cover 100 that is overmolded to wall plate 114 of electrical wiring device 112, such as after initial manufacturing of wall plate 114. Front face 120 of cover 100 is formed from a flexible, transparent membrane to allow operation of wiring device 112 while avoiding any include any crevices, slots, or other features that will interfere with cleaning of electrical wiring device 112 once installed in a location. Underplate mounts 140, which can be part of a legacy device or a new part provided with cover 100 may be used to couple cover 100 to wiring device 112.

Figure 4:
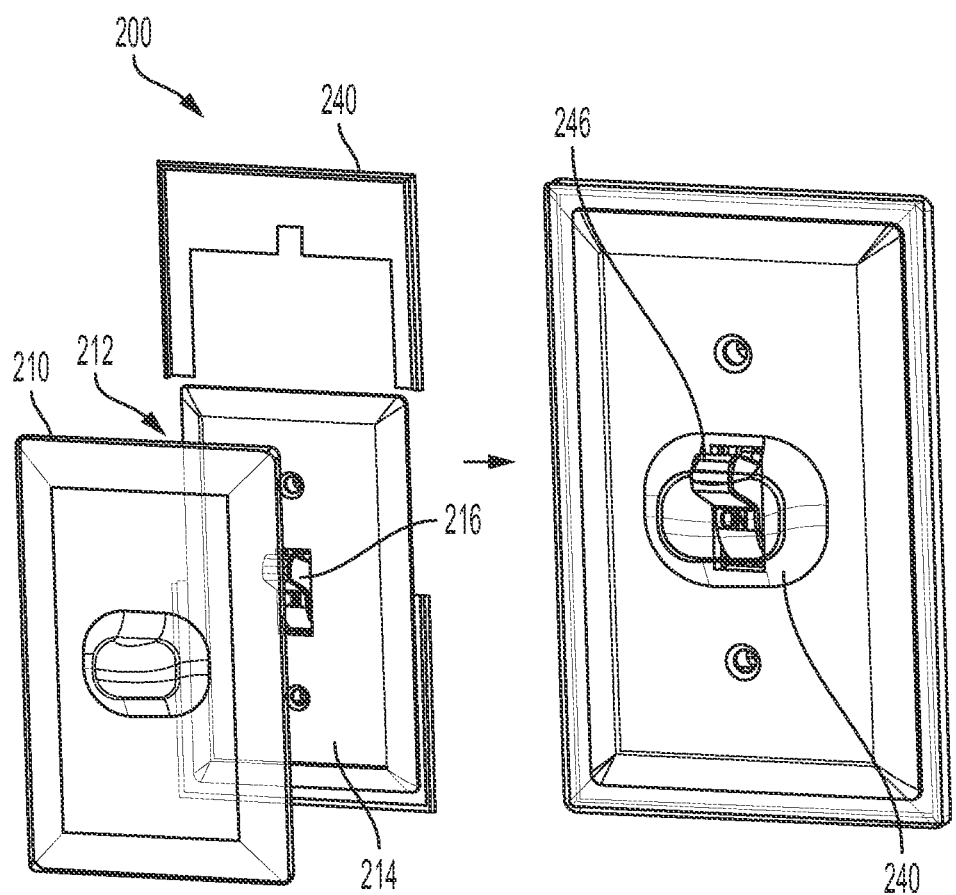
FIG. 4 is an exploded view and an assembled view of an additional embodiment of an easily cleaned surface of an electrical wiring device according to the present invention.
Figure 5:
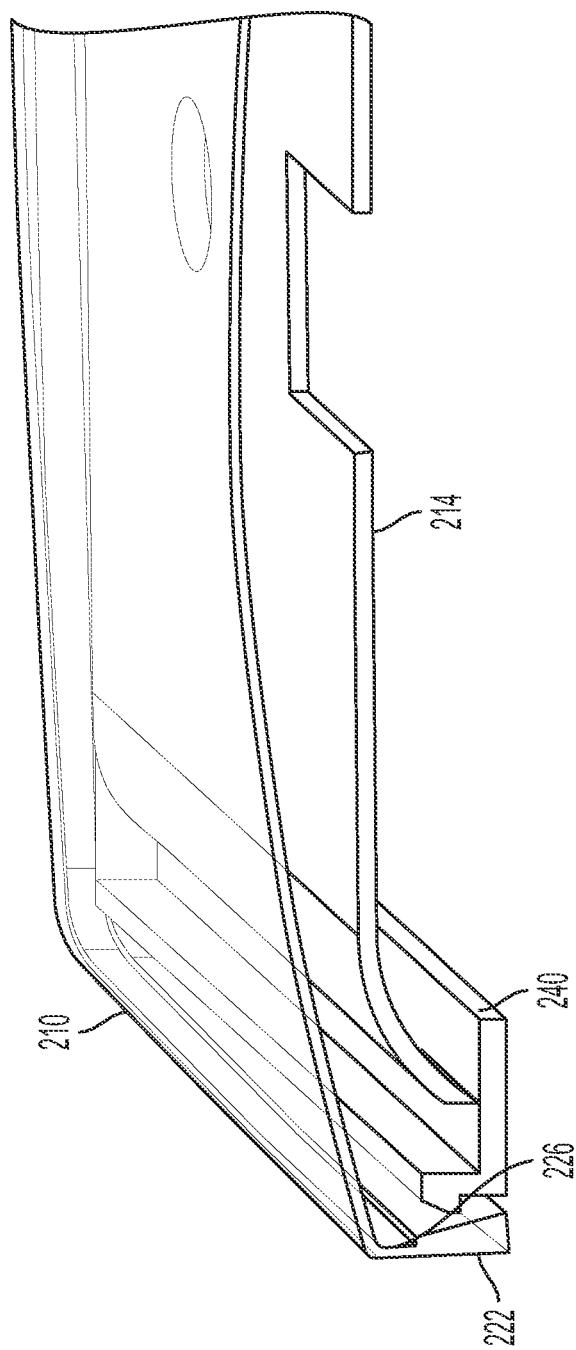
FIG. 5 is a cross-sectional view of a portion of the embodiment of FIG. 4.
Figure 6:
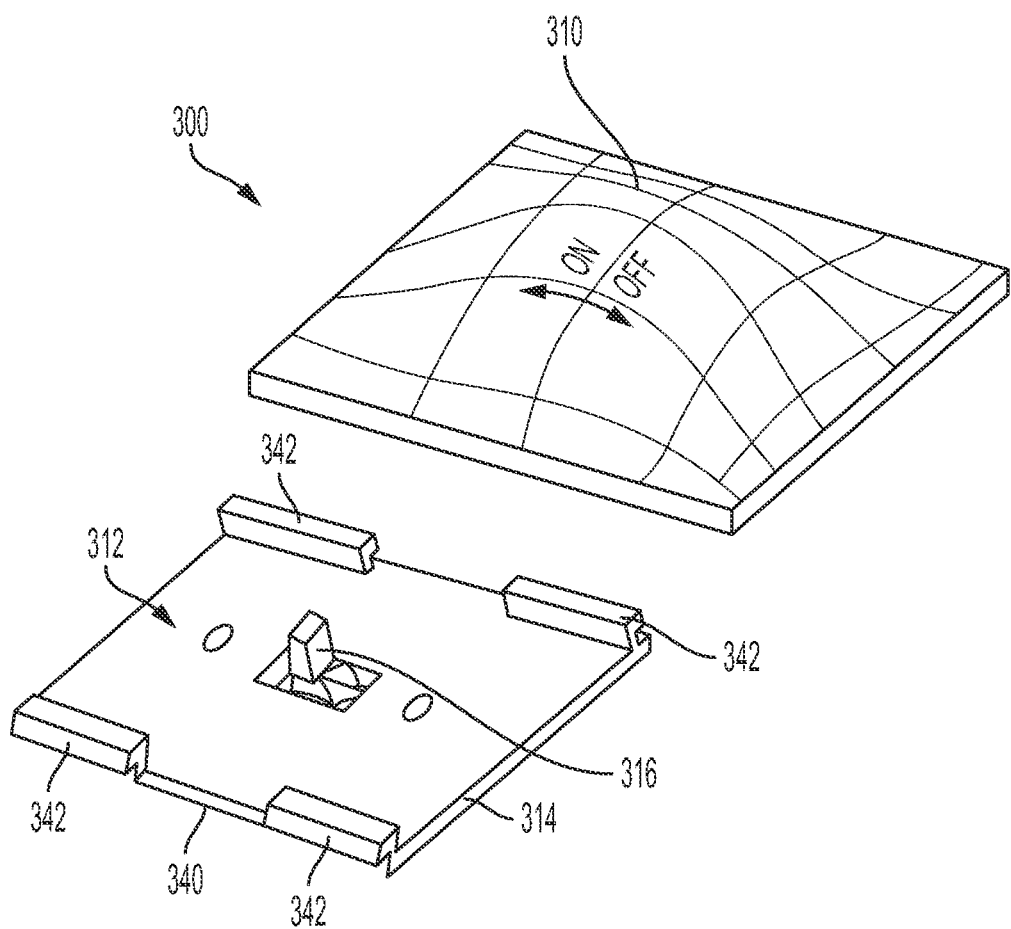
FIG. 6 is perspective view of a further embodiment of an easily cleaned surface of an electrical wiring device according to the present invention.

Referring to FIG. 4, an embodiment of the present invention comprises a cover assembly 200 for retrofitting an existing electrical wiring device 212. Cover assembly 200 comprises a sleeve 210 that can placed in covering relation to an electrical wiring device 212, such as a wall plate 214 having a light switch 216 positioned therein. Cover system 200 includes a pair of underplate mounts 240 dimensioned to be inserted under wall plate 214 of existing electrical wiring device 212 and provide an attachment location for sleeve 210. Underplate mounts 240 can thus be inserted behind existing electrical wiring device 212 by removing or loosening the mounting screws 242 of wall plate 214 and then sliding underplate mounts 240 into position behind wall plate 214. Referring to FIG. 5, sleeve 210 includes a wall 222 extending around the peripheral edge 224 of front face 220 and formed integrally therewith. Wall 222 of sleeve 210 includes an undercut 226 positioned around the inside thereof that is dimensioned to allow sleeve 210 to be snap fit over underplate mounts 240. As seen in FIG. 6, sleeve 210 may be contoured accommodate the design of light switch 216, such as by forming a flexible dome 244 to accept a toggle 246 of light switch 216 and allow switch 216 to be operated by a user.

Figure 7:
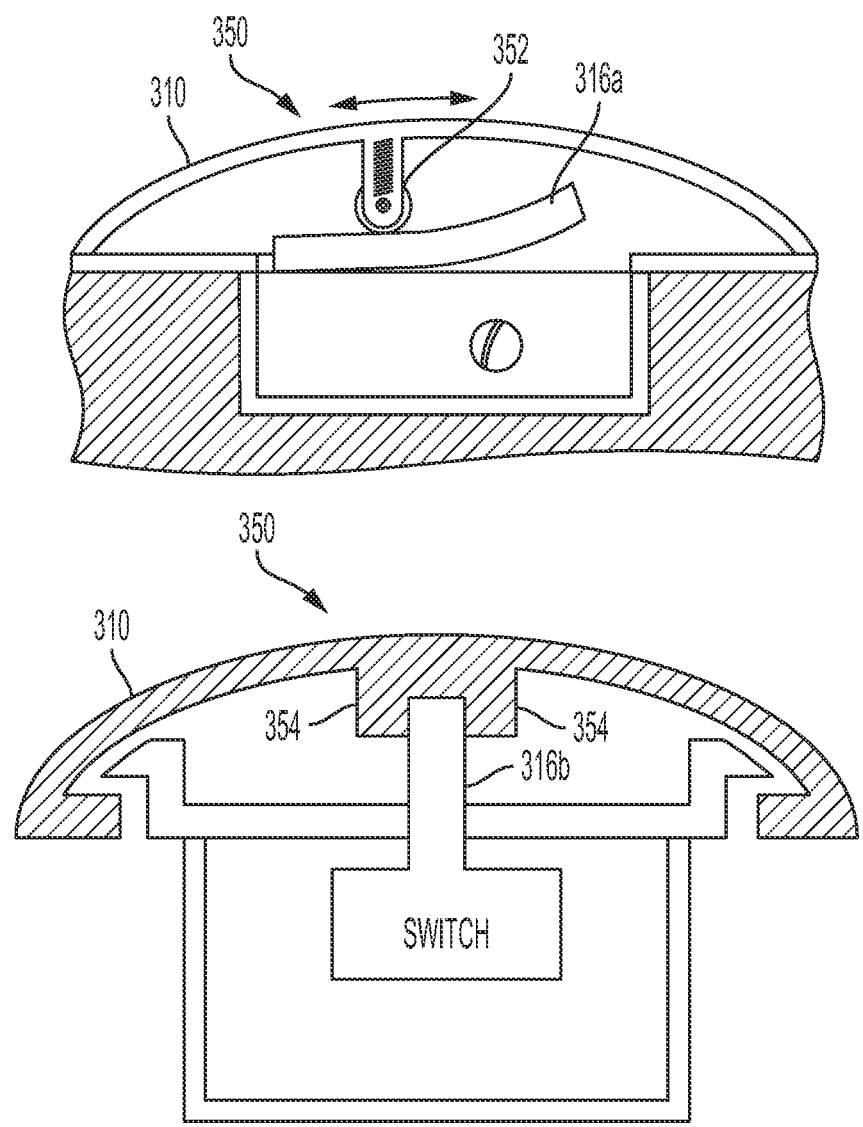
FIG. 7 is a pair of cross-sectional views of the embodiment of FIG. 6 illustrated different approaches for coupling to the switch of the electrical wiring device.

Referring to FIG. 6, an embodiment of the present invention comprises a cover system 300 having a rigid cover 310 that interfaces with an underplate mount 340 that is installed under the wall plate 314 of a wiring device 312. Underplate mount 340 includes rails 342 extending along opposing edges thereof that allow cover 310 to slide relative to underplate mount 340. The inside surface 348 of cover 310 includes one or more features 350 that can operate the particular wiring device to which cover system 300 is to be used. For example, as seen in FIG. 7, cover 310 may include a roller 352 that can operate a rocker style switch 316a in response to manual movement of cover 310 along rails 342. Alternatively, cover 310 may include a pair of projections 354 that can drive a toggle style switch 316b into the on and off positions in response to manual movement of cover 310 along rails 342.

Figure 8:
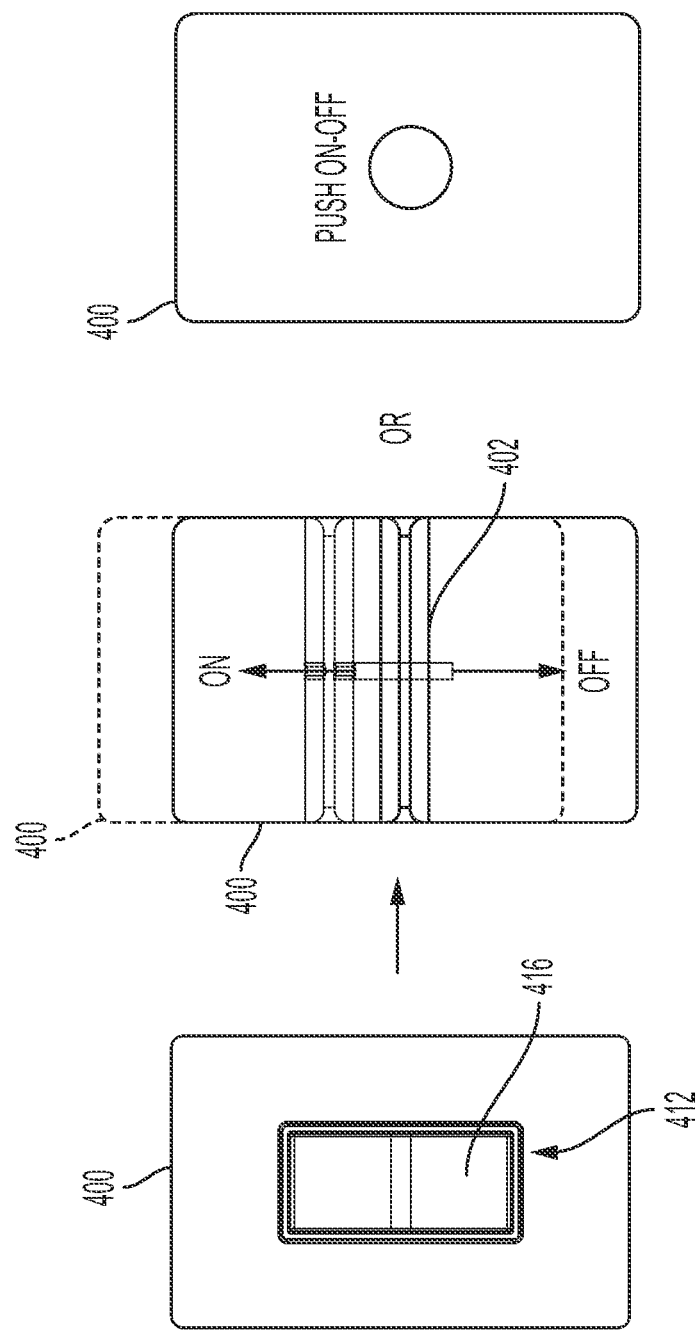
FIG. 8 is a series of schematics of an additional embodiment of an easily cleaned surface of an electrical wiring device according to the present invention.

Referring to FIG. 8, an embodiment of the present invention comprises a cover 400 that is directly coupled to the switch 416 of an electrical wiring device 412. Cover 400 replaces the conventional switch 416 so that the entire front face 420 of cover 400 is operated to switch wiring device 412 between ON and OFF. For example, as seen in FIG. 8, cover 400 may be formed to include an integrally formed bar 402 that extends across face 420 to provide a grasping point for a user to move cover 400 (shown as moveable vertically as an example) to operate wiring device 412, e.g., select between ON and OFF positions. As further seen in FIG. 10, cover 400 can also be used to operate a push button style wiring device 412 mounted to a wall 402 simply be pushing a portion of cover 400. It should be understood that these options may require wiring device 412 to be formed in combination with cover 400 and adapted for the specific type of switch 416, and thus may not be suitable for retrofit applications. A subframe 404 may extend around the outside of the exposed portion of wiring device 412 to minimize access to the internal components of wiring device 12.

Figure 9:
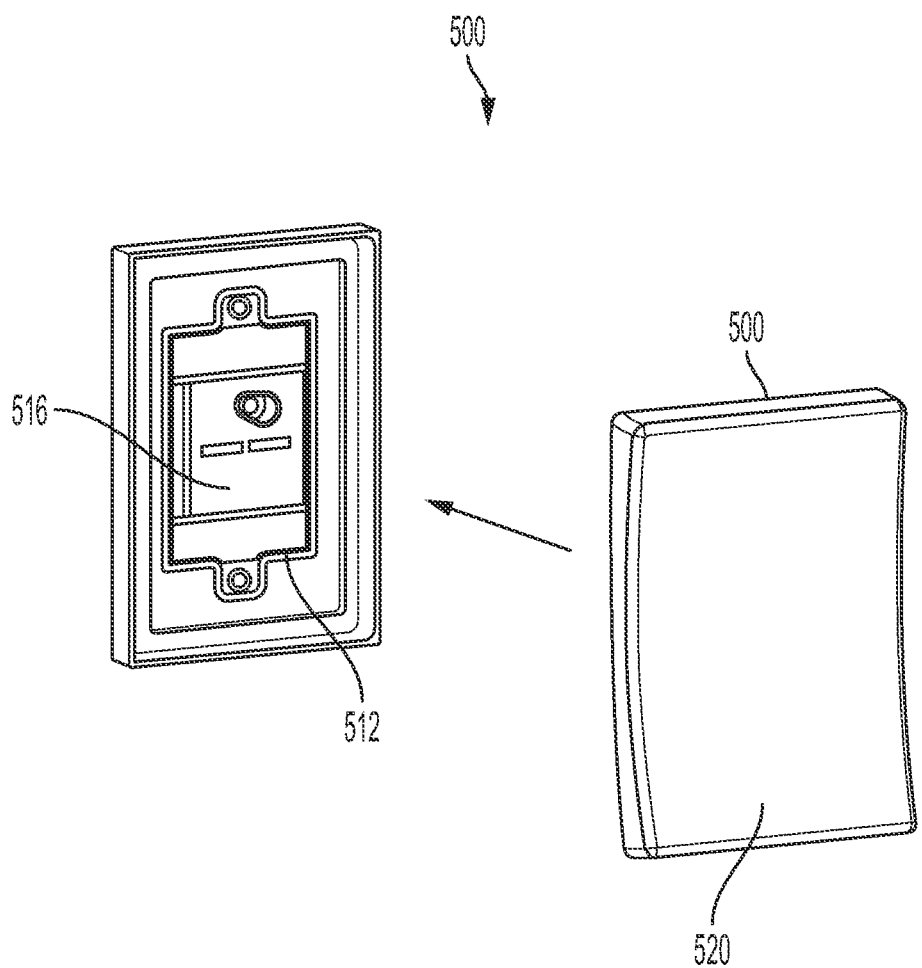
FIG. 9 is an exploded view of yet another embodiment of an easily cleaned surface of an electrical wiring device according to the present invention.
Figure 10:
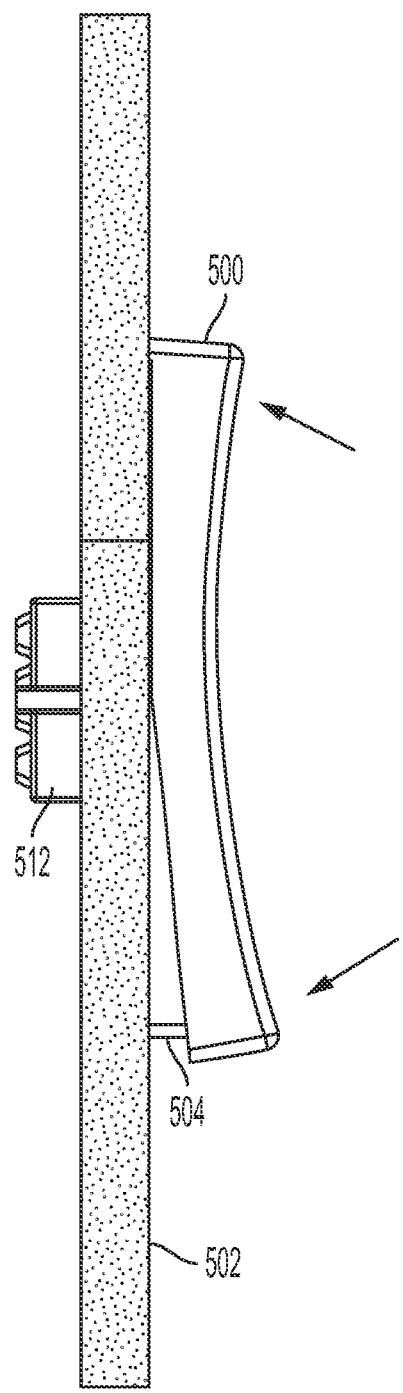
FIG. 10 is a side view the embodiment of FIG. 9.

Referring to FIG. 9, an embodiment of the present invention comprises a cover 500 dimensioned to completely enclose wiring device 512 in lieu of wall plate and be operatively attached to wiring device 512 in lieu of switch 16. Cover 500 may thus be rocked or slid to directly operate wiring device 512, e.g., select between ON and OFF positions. As seen in FIG. 10, a subframe 504 may extend around the peripheral edge of wiring device 512 to minimize access to the internal components of wiring device 512. Cover 500 is dimensioned to completely enclose wiring device 512. Cover 500 is rigid and may be formed from a chemically resistant or antibacterial plastic material.

Figure 11:
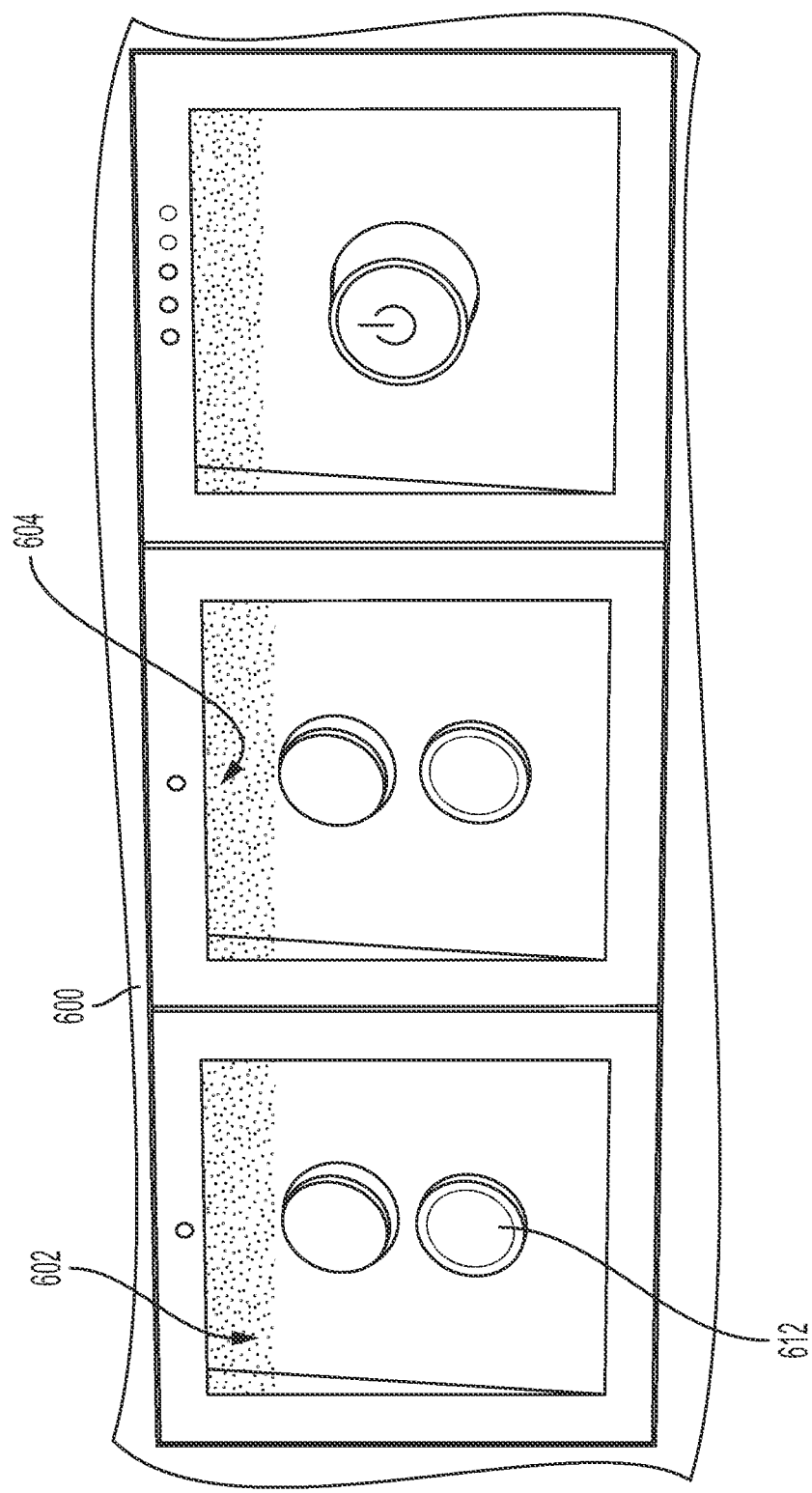
FIG. 11 is a perspective view of an additional embodiment of an easily cleaned surface of an electrical wiring device according to the present invention.

Referring to FIG. 11, an embodiment of the present invention comprises a wiring device housing 600 having one or more recesses 602 for accommodating electrical wiring devices 612. UV light sources 604 are positioned in housing 600 to direct UV light onto the surfaces of wiring devices 612. UV light sources 604 may be periodically energized to disinfect the surfaces of wiring device 612 that come into contact with users.

Figure 12:
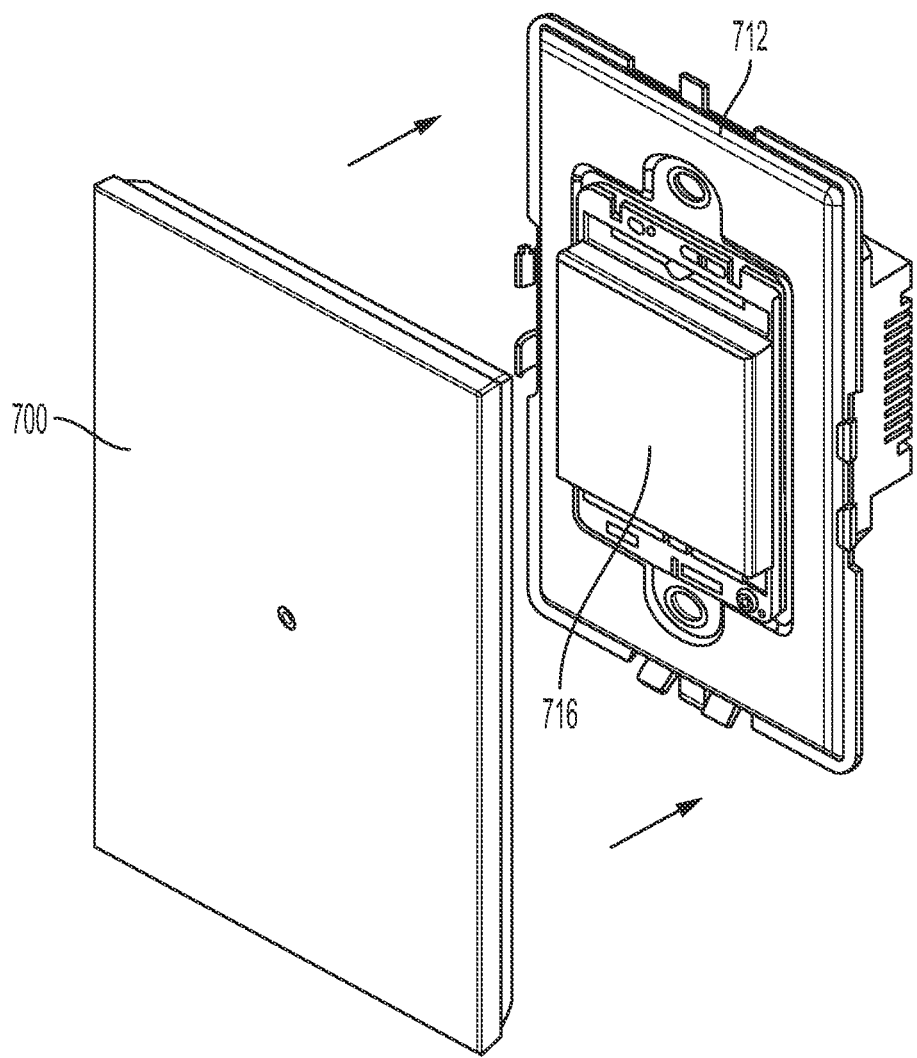
FIG. 12 is an exploded view of a further embodiment of an easily cleaned surface of an electrical wiring device according to the present invention.

Referring to FIG. 12, an embodiment of the present invention comprises a cover 700 for use with a wiring device 712 operated by a touch switch 716. Cover 700 may be formed from glass and extend to completely cover wiring device 712, thereby avoiding the need for a wall plate 14. Touch switch 716 can be operated through cover 700, and can be provided for single gang or multi-gang arrangements.

While several inventive embodiments have been described and illustrated herein with reference to certain exemplary embodiments, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein (and it will be understood by one skilled in the art that various changes in detail may be effected therein without departing from the spirit and scope of the invention as defined by claims that can be supported by the written description and drawings). More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed. Further, where exemplary embodiments are described with reference to a certain number of elements it will be understood that the exemplary embodiments can be practiced utilizing either less than or more than the certain number of elements.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if not directly attached to where there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalent.

What is claimed is:

1. An electrical wiring device assembly, comprising: a sleeve dimensioned to be positioned in covering relation to a front of an electrical wiring device, wherein the sleeve has a uniform user facing surface, wherein the uniform user facing surface omits crevices, gaps, protrusions, or indentations and includes a wall extending around a peripheral edge of the uniform user facing surface; the wall has a first inclined surface extending toward a rocker switch of the electrical wiring device assembly and an undercut extending around an interior of the sleeve between the uniform user facing surface and the first inclined surface for engaging with a plate of the electrical wiring device; and the plate of the electrical wiring device assembly comprises a mounting plate having a set of protruded rails and second inclined surfaces for slidingly engaging opposite sides of the undercut and the first inclined surface respectively so that the sleeve can move between a first position and second position to activate and deactivate the rocker switch of the electrical wiring device assembly respectively; and a subframe coupled to the electrical wiring device and forming a barrier preventing access to an interior of the electrical wiring device.

2. The electrical wiring device assembly of claim 1, wherein the plate of the electrical wiring device comprises a wall plate of the electrical wiring device.

3. The electrical wiring device assembly of claim 1, wherein the mounting plate is configured to be positioned behind the wall plate of the electrical wiring device.

4. The electrical wiring device assembly of claim 1, wherein the sleeve is flexible.

5. The electrical wiring device of claim 1, wherein the cover is formed of a chemically resistant or antibacterial material.

6. The electrical wiring device of claim 5, wherein the electrical wiring device includes a front surface extending in a first plane and a peripheral edge extending in a second plane and wherein the cover is fully positioned over the front surface and around the peripheral edge.

* * * * *